United States Patent
Kim et al.

(10) Patent No.: US 11,823,730 B2
(45) Date of Patent: Nov. 21, 2023

(54) INTEGRATED CIRCUIT AND MEMORY DEVICE INCLUDING SAMPLING CIRCUIT

(71) Applicant: SK hynix Inc., Gyeonggi-do (KR)

(72) Inventors: Woongrae Kim, Gyeonggi-do (KR); Byeong Yong Go, Gyeonggi-do (KR); Chul Moon Jung, Gyeonggi-do (KR); Yoonna Oh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 119 days.

(21) Appl. No.: 17/703,586

(22) Filed: Mar. 24, 2022

(65) Prior Publication Data
US 2023/0178137 A1 Jun. 8, 2023

(30) Foreign Application Priority Data
Dec. 3, 2021 (KR) ................ 10-2021-0172410

(51) Int. Cl.
*G11C 11/4076* (2006.01)
*G11C 11/406* (2006.01)
*G11C 11/408* (2006.01)

(52) U.S. Cl.
CPC ........ *G11C 11/4076* (2013.01); *G11C 11/406* (2013.01); *G11C 11/4085* (2013.01)

(58) Field of Classification Search
CPC .................................................. G11C 11/4076
See application file for complete search history.

(56) References Cited

U.S. PATENT DOCUMENTS

| | | | |
|---|---|---|---|
| 10,170,174 B1 | 1/2019 | Ito et al. | |
| 2011/0058437 A1* | 3/2011 | Miyano | .................. H03L 7/095 327/158 |
| 2020/0294569 A1 | 9/2020 | Wu et al. | |

* cited by examiner

*Primary Examiner* — Jason Lappas
(74) *Attorney, Agent, or Firm* — IP & T GROUP LLP

(57) ABSTRACT

An integrated circuit includes: first and second pattern generation circuits generating first and second pattern signal for a sampling section; a first section control part generating a coarse section signal for a first section of the sampling section, according to the first pattern signal; a first filter part generating a first section extract signal by filtering the second pattern signal according to the coarse section signal; a second section control part generating a fine section signal for a second section of the sampling section, according to the first section extract signal; a second filter part generating a second section extract signal by filtering the second pattern signal according to the fine section signal; an output control circuit generating a sampling enable signal according to the first and second section extract signals; and a sampling circuit suitable for sampling an input signal according to the sampling enable signal.

20 Claims, 8 Drawing Sheets

INTEGRATED CIRCUIT AND MEMORY DEVICE INCLUDING SAMPLING CIRCUIT

CROSS-REFERENCE TO RELATED APPLICATION

The present application claims the benefit of Korean Patent Application No. 10-2021-0172410, filed on Dec. 3, 2021, which is incorporated herein by reference in its entirety.

BACKGROUND

1. Field

Various embodiments of the present invention relate to a semiconductor design technology, and more particularly, to a memory device including a sampling circuit that randomly samples input signals.

2. Description of the Related Art

Recently, in addition to a normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or adjacent word lines disposed adjacent to the specific word line are damaged due to a high number of activations of the specific word line. In order to prevent the row hammering phenomenon, a target refresh operation is performed on a word line that is activated more than a predetermined number of times, and adjacent word lines disposed adjacent to the word line.

In the target refresh operation, word lines on which the target refresh operation is to be performed may be selected by randomly sampling addresses based on probability. Accordingly, research on a sampling circuit for randomly sampling addresses has been conducted.

SUMMARY

Embodiments of the present invention are directed to an integrated circuit and a memory device including a sampling circuit capable of randomly sampling addresses.

According to an embodiment of the present invention, an integrated circuit includes a first pattern generation circuit suitable for generating a first pattern signal randomly pulsing for a sampling section; a second pattern generation circuit suitable for generating a second pattern signal randomly pulsing for the sampling section; a first section control part suitable for generating a coarse section signal enabled for a first section of the sampling section, according to the first pattern signal; a first filter part suitable for generating a first section extract signal by filtering the second pattern signal according to the coarse section signal; a second section control part suitable for generating a fine section signal enabled for a second section of the sampling section, according to the first section extract signal; a second filter part suitable for generating a second section extract signal by filtering the second pattern signal according to the fine section signal; an output control circuit suitable for generating a sampling enable signal according to the first section extract signal and the second section extract signal; and a sampling circuit suitable for sampling an input signal according to the sampling enable signal.

According to an embodiment of the present invention, an operating method of an integrated circuit includes dividing a sampling section into a plurality of coarse sections; generating a first pattern signal that is randomly pulsing for each of the coarse sections; dividing the sampling section into a plurality of fine sections; generating a second pattern signal that is randomly pulsing for each of the fine sections; randomly selecting one of the coarse sections; randomly selecting one of the fine sections for the selected coarse section; generating a sampling enable signal according to the second pattern signal that is pulsing for the selected fine section; and sampling an input signal according to the sampling enable signal.

According to an embodiment of the present invention, a memory device includes a first pattern generation circuit suitable for dividing a target refresh section into a plurality of coarse sections, and generating a first pattern signal that is randomly pulsing for each of the coarse sections; a second pattern generation circuit suitable for dividing the target refresh section into a plurality of fine sections, and generating a second pattern signal that is randomly pulsing for each of the fine sections; a first section extract circuit suitable for generating a first section extract signal by extracting the second pattern signal for a coarse section randomly selected from the coarse sections according to the first pattern signal; a second section extract circuit suitable for generating a second section extract signal by extracting the second pattern signal for a fine section randomly selected from the fine sections according to the first section extract signal; an output control circuit suitable for generating a sampling enable signal according to the first section extract signal and the second section extract signal; and a sampling circuit suitable for outputting a target address by sampling an active address according to the sampling enable signal.

According to an embodiment of the present invention, an operating method of an integrated circuit includes generating a sampling enable signal according to a pattern signal, which pulses during a selected one of plural fine sections, the selected fine section falling in a selected one of plural coarse sections; and sampling an address according to the sampling enable signal, wherein the coarse sections and the fine sections have random periods, and wherein the periods of the fine sections are shorter than the periods of the coarse sections.

Further, according to embodiments of the present invention, the integrated circuit may address periodicity of the sampling circuit and maximize randomization by performing sampling using dual pattern generation circuits operating at different cycles. In addition, according to embodiments of the present invention, the integrated circuit may maximize accuracy of address sampling and improve efficiency of the target refresh operation by applying a sampling circuit to a memory device performing a target refresh operation by sampling addresses based on probability.

DETAILED DESCRIPTION

Figure 1:
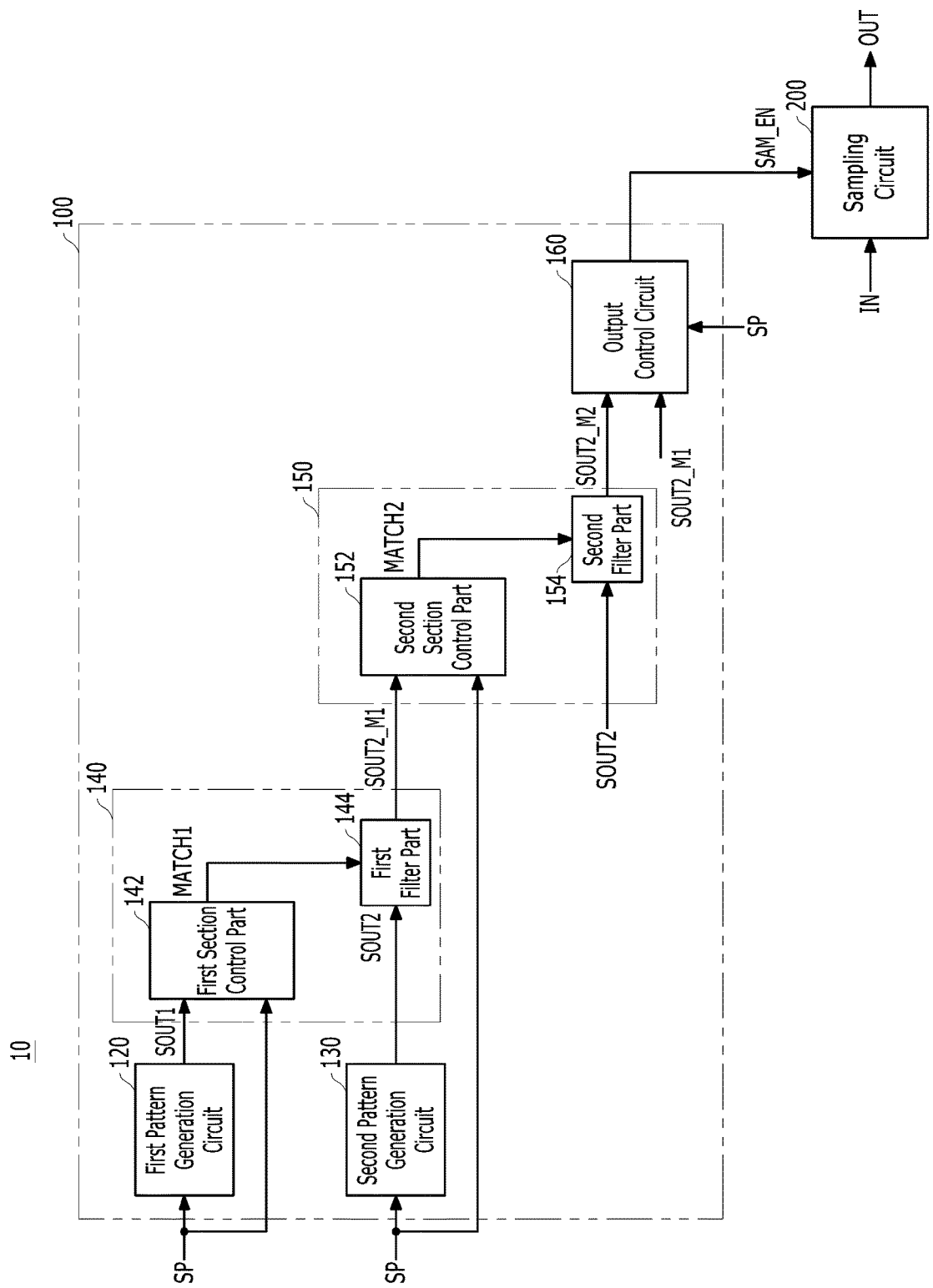
FIG. 1 is a block diagram illustrating an integrated circuit in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

FIG. 1 is a block diagram illustrating an integrated circuit 10 in accordance with an embodiment of the present invention.

Referring to FIG. 1, the integrated circuit 10 may include a sampling control circuit 100 and a sampling circuit 200.

The sampling control circuit 100 may generate a sampling enable signal SAM_EN that is randomly enabled for a sampling section. The sampling control circuit 100 may include at least two pattern generation circuits 120 and 130 having different periods, and generate a first pattern signal SOUT1 and a second pattern signal SOUT2, which are randomly pulsing with different periods for the sampling section. Based on the first pattern signal SOUT1 and the second pattern signal SOUT2, the sampling control circuit 100 may generate the sampling enable signal SAM_EN. For reference, the sampling section may be determined by a sampling section signal SP, and the sampling section may be defined by adjacent two sampling section signals SP.

The sampling circuit 200 may generate an output signal OUT by sampling an input signal IN according to the sampling enable signal SAM_EN.

In detail, the sampling control circuit 100 may include a first pattern generation circuit 120, a second pattern generation circuit 130, a first section extract circuit 140, a second section extract circuit 150, and an output control circuit 160.

The first pattern generation circuit 120 may generate the first pattern signal SOUT1 that is randomly pulsing for the sampling section. The first pattern generation circuit 120 may be activated in response to a rising edge of the sampling section signal SP. The first pattern generation circuit 120 may divide the sampling section into a plurality of coarse sections, and generate the first pattern signal SOUT1 that is randomly pulsing for each coarse section. At this time, each of the plurality of coarse sections may have a random period or length. The first pattern generation circuit 120 may be defined as a coarse pattern generation circuit.

The second pattern generation circuit 130 may generate the second pattern signal SOUT2 that is randomly pulsing for the sampling section. The second pattern generation circuit 130 may be activated in response to a rising edge of the sampling section signal SP. The second pattern generation circuit 130 may divide the sampling section into a plurality of fine sections, and generate the second pattern signal SOUT2 that is randomly pulsing for each fine section. At this time, each of the plurality of fine sections may have a random period or length, and may have a period shorter than any of the coarse sections. That is, the second pattern generation circuit 130 may operate with a period shorter than the first pattern generation circuit 120, and thus, the second pattern generation circuit 130 may generate the second pattern signal SOUT2 that is randomly pulsing with a period shorter than that of the first pattern signal SOUT1. The second pattern generation circuit 130 may be defined as a fine pattern generation circuit.

Each of the first pattern generation circuit 120 and the second pattern generation circuit 130 may be implemented with a pseudo-random binary sequence (PRBS) based random pattern generator, or a linear feedback shift register (LFSR) based random pattern generator. For example, the first pattern generation circuit 120 and the second pattern generation circuit 130 may be implemented with the PRBS based random pattern generator. At this time, the first pattern generation circuit 120 and the second pattern generation circuit 130 may be implemented as a uniform random number sequence generator capable of generating pattern signals randomly pulsing the same number of times within a specific period rather than a round robin method.

The first section extract circuit 140 may select one of the coarse sections according to the first pattern signal SOUT1, and generate a first section extract signal SOUT2_M1 by extracting the second pattern signal SOUT2 for the selected coarse section. For example, the first section extract circuit 140 may include a first section control part 142 and a first filter part 144.

The first section control part 142 may generate a coarse section signal MATCH1 that is enabled for a first section of the sampling section, according to the first pattern signal SOUT1. The first section control part 142 may randomly select one of the coarse sections based on the sampling section signal SP and the first pattern signal SOUT1, and generate the coarse section signal MATCH1 that is enabled for the selected coarse section corresponding to the first section.

The first filter part 144 may generate the first section extract signal SOUT2_M1 by filtering the second pattern signal SOUT2 according to the coarse section signal MATCH1. The first filter part 144 may output the second pattern signal SOUT2 as the first section extract signal SOUT2_M1 for an activation section of the coarse section signal MATCH1. Accordingly, during the activation section of the coarse section signal MATCH1, some fine sections may be extracted from the fine sections.

The second section extract circuit 150 may select one of the fine sections according to the first section extract signal SOUT2_M1, and generate a second section extract signal SOUT2_M2 by extracting the second pattern signal SOUT2 for the selected fine section. For example, the second section extract circuit 150 may include a second section control part 152 and a second filter part 154.

The second section control part 152 may generate a fine section signal MATCH2 that is enabled for a second section of the sampling section, according to the first section extract signal SOUT2_M1. The second section control part 152 may randomly select one of some fine sections extracted from the fine sections, based on the sampling section signal SP and the first section extract signal SOUT2_M1, and generate the fine section signal MATCH2 that is enabled for the selected fine section corresponding to the second section.

The second filter part 154 may generate the second section extract signal SOUT2_M2 by filtering the second pattern signal SOUT2 according to the fine section signal MATCH2. The second filter part 154 may output the second pattern signal SOUT2 as the second section extract signal SOUT2_M2 for an activation section of the fine section signal MATCH2. Depending on an embodiment, the second filter part 154 may output the second pattern signal SOUT2 by filtering the second section extract signal SOUT2_M2 according to the fine section signal MATCH2.

The output control circuit 160 may generate the sampling enable signal SAM_EN according to the first section extract signal SOUT2_M1 and the second section extract signal SOUT2_M2. The output control circuit 160 may set a final section signal (FINAL_S of FIG. 6) for the sampling section according to the second section extract signal SOUT2_M2, and generate the sampling enable signal SAM_EN by filtering the first section extract signal SOUT2_M1 according to the final section signal FINAL_S.

Figure 2:
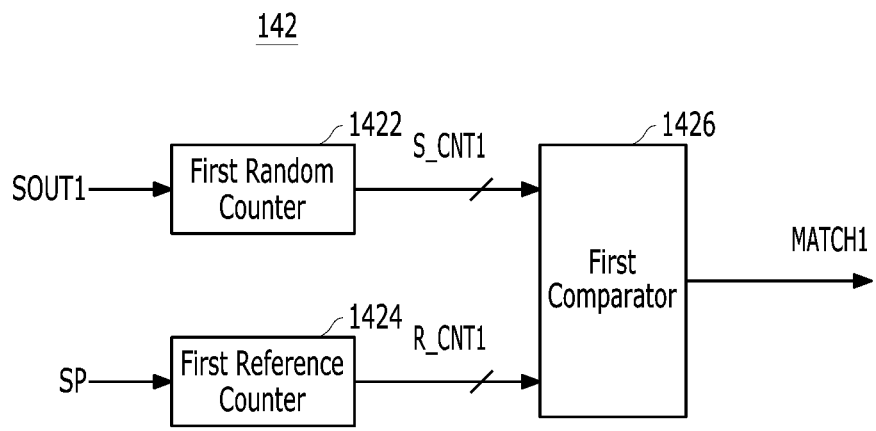
FIG. 2 is a detailed configuration diagram illustrating a first section control circuit shown in FIG. 1 in accordance with an embodiment of the present invention.
Figure 3:
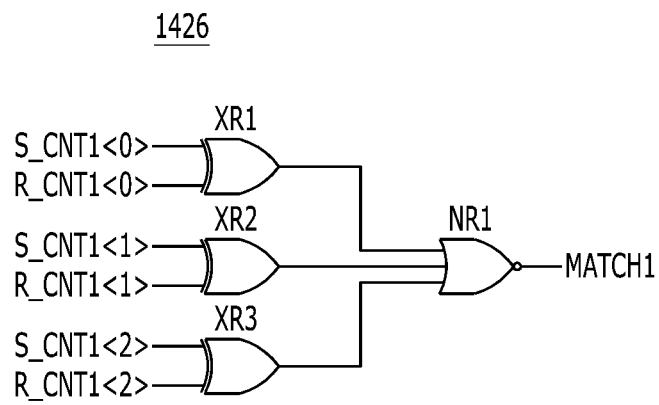
FIG. 3 is a detailed circuit diagram illustrating a first comparator shown in FIG. 2 in accordance with an embodiment of the present invention.

FIG. 2 is a detailed configuration diagram illustrating the first section control part 142 shown in FIG. 1 in accordance with an embodiment of the present invention. FIG. 3 is a detailed circuit diagram illustrating a first comparator 1426 shown in FIG. 2 in accordance with an embodiment of the present invention.

Referring to FIG. 2, the first section control part 142 may include a first random counter 1422, a first reference counter 1424, and a first comparator 1426.

The first random counter 1422 may count the toggling number of the first pattern signal SOUT1 to generate a first sampling counting signal S_CNT1. The first reference counter 1424 may count the number of inputs of the sampling section signal SP to generate a first reference counting signal R_CNT1. For example, the first reference counter 1424 may increase a value of the first reference counting signal R_CNT1 by "+1" when the sampling section signal is inputted. The first comparator 1426 may output the coarse section signal MATCH1 by comparing the first sampling counting signal S_CNT1 with the first reference counting signal R_CNT1. The first comparator 1426 may enable the coarse section signal MATCH1 when bits of the first sampling counting signal S_CNT1 are identical to bits of the first reference counting signal R_CNT1.

For example, referring to FIG. 3, when the first sampling counting signal S_CNT1 and the first reference counting signal R_CNT1 are respectively composed of 3 bits, the first comparator 1426 may include first to third exclusive OR gates XR1 to XR3, and a NOR gate NR2. The first to third exclusive OR gates XR1 to XR3 may respectively perform a logic XOR operation on the respective bits of the first sampling counting signal S_CNT1 and the respective bits of the first reference counting signal R_CNT1. The NOR gate NR2 may perform a logic NOR operation on outputs of the first to third exclusive OR gates XR1 to XR3, to output the coarse section signal MATCH1. With the above configuration, the first comparator 1426 may generate the coarse signal MATCH1 enabled to a logic high level when each bit of the first reference counting signal R_CNT1 matches each bit of the first sampling counting signal S_CNT1.

Figure 4:
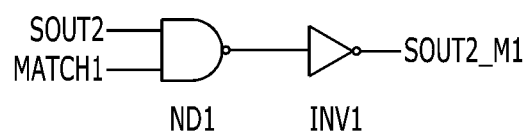
FIG. 4 is a detailed configuration diagram illustrating a first filter circuit shown in FIG. 1 in accordance with an embodiment of the present invention.

FIG. 4 is a detailed configuration diagram illustrating the first filter circuit 144 shown in FIG. 1 in accordance with an embodiment of the present invention.

Referring to FIG. 4, the first filter part 144 may include a NAND gate ND1 and an inverter INV1. The NAND gate ND1 may perform a logic NAND operation on the second pattern signal SOUT2 and the coarse section signal MATCH1. The inverter INV1 may invert an output of the NAND gate ND1 to output the first section extract signal SOUT2_M1. With the above configuration, the first filter part 144 may perform a logic AND operation on the second pattern signal SOUT2 and the coarse section signal MATCH1 and output the first section extract signal SOUT2_M1 enabled to a logic high level when both of the second pattern signal SOUT2 and the coarse section signal MATCH1 are enabled.

Moreover, the second filter part 154 may have substantially the same configuration as the first filter part 144 shown in FIG. 4. That is, the second filter part 154 may include a NAND gate and an inverter, and output the second section extract signal SOUT2_M2 by performing a logic AND operation on the fine section signal MATCH2 and the second pattern signal SOUT2.

Figure 5:
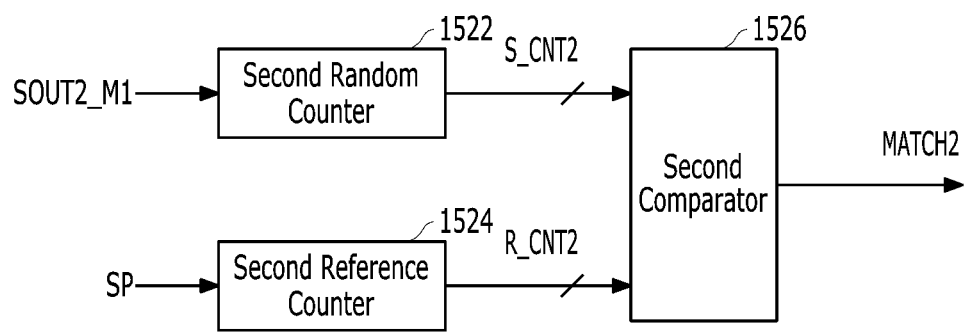
FIG. 5 is a detailed configuration diagram illustrating a second section control circuit shown in FIG. 1 in accordance with an embodiment of the present invention.

FIG. 5 is a detailed configuration diagram illustrating the second section control circuit 152 shown in FIG. 1 in accordance with an embodiment of the present invention.

Referring to FIG. 5, the second section control circuit 152 may include a second random counter 1522, a second reference counter 1524, and a second comparator 1526.

The second random counter 1522 may count the toggling number of the first section extract signal SOUT2_M1 to generate a second sampling counting signal S_CNT2. The second reference counter 1524 may count the number of inputs of the sampling section signal SP to generate a second reference counting signal R_CNT2. For example, the second reference counter 1524 may increase a value of the second reference counting signal R_CNT2 by "+2" when the sampling section signal is inputted. That is, the first reference counter 1524 and the second reference counter 1524 may generate the first reference counting signal R_CNT1 and the second reference counting signal R_CNT2, which increase to different values, thereby maximizing the randomization of the sampling circuit. Depending on an embodiment, the first reference counter 1524 and the second reference counter 1524 may set the first reference counting signal R_CNT1 and the second reference counting signal R_CNT2 to have different initial values. The second comparator 1526 may output the fine section signal MATCH2 by comparing the second sampling counting signal S_CNT2 with the second reference counting signal R_CNT2. The second comparator 1526 may be composed of a plurality of gates for performing a logic XNOR operation on respective bits of the second sampling counting signal S_CNT2 and the second reference counting signal R_CNT2, and enable the fine section signal MATCH2 to a logic high level when each bit of the second reference counting signal R_CNT2 matches each bit of the second sampling counting signal S_CNT2. For example, the second comparator 1526 may have substantially the same configuration as the first comparator 1426 shown in FIG. 3.

Figure 6:
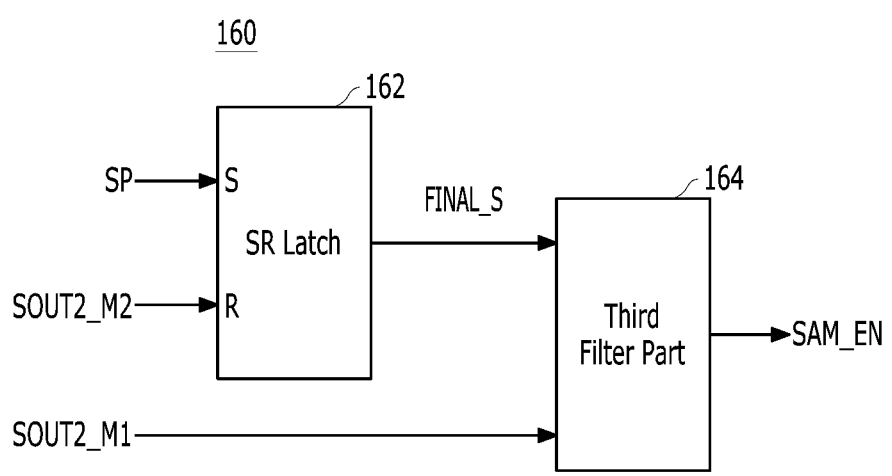
FIG. 6 is a detailed configuration diagram illustrating an output control circuit shown in FIG. 1 in accordance with an embodiment of the present invention.

FIG. 6 is a detailed configuration diagram illustrating the output control circuit 160 shown in FIG. 1 in accordance with an embodiment of the present invention.

Referring to FIG. 6, the output control circuit 160 may include a set-reset (SR) latch 162 and a third filter circuit 164.

The SR latch 162 may generate the final section signal FINAL_S that is set according to the sampling section signal SP and reset according to the second section extract signal SOUT2_M2. The third filter circuit 164 may output the sampling enable signal SAM_EN by filtering the first section extract signal SOUT2_M1 according to the final section signal FINAL_S. The third filter circuit 164 may output the first section extract signal SOUT2_M1 as the sampling enable signal SAM_EN for an activation section of the final section signal FINAL_S. For example, the third filter circuit 164 may have substantially the same configuration as the first filter circuit 144 shown in FIG. 4. That is, the third filter circuit 164 may include a NAND gate and an inverter, and output the sampling enable signal SAM_EN by performing a logic AND operation on the final section signal FINAL_S and the first section extract signal SOUT2_M1.

Hereinafter, referring to FIGS. 1 to 7, a sampling operation of the integrated circuit 10 according to an embodiment of the present invention will be described.

Figure 7:
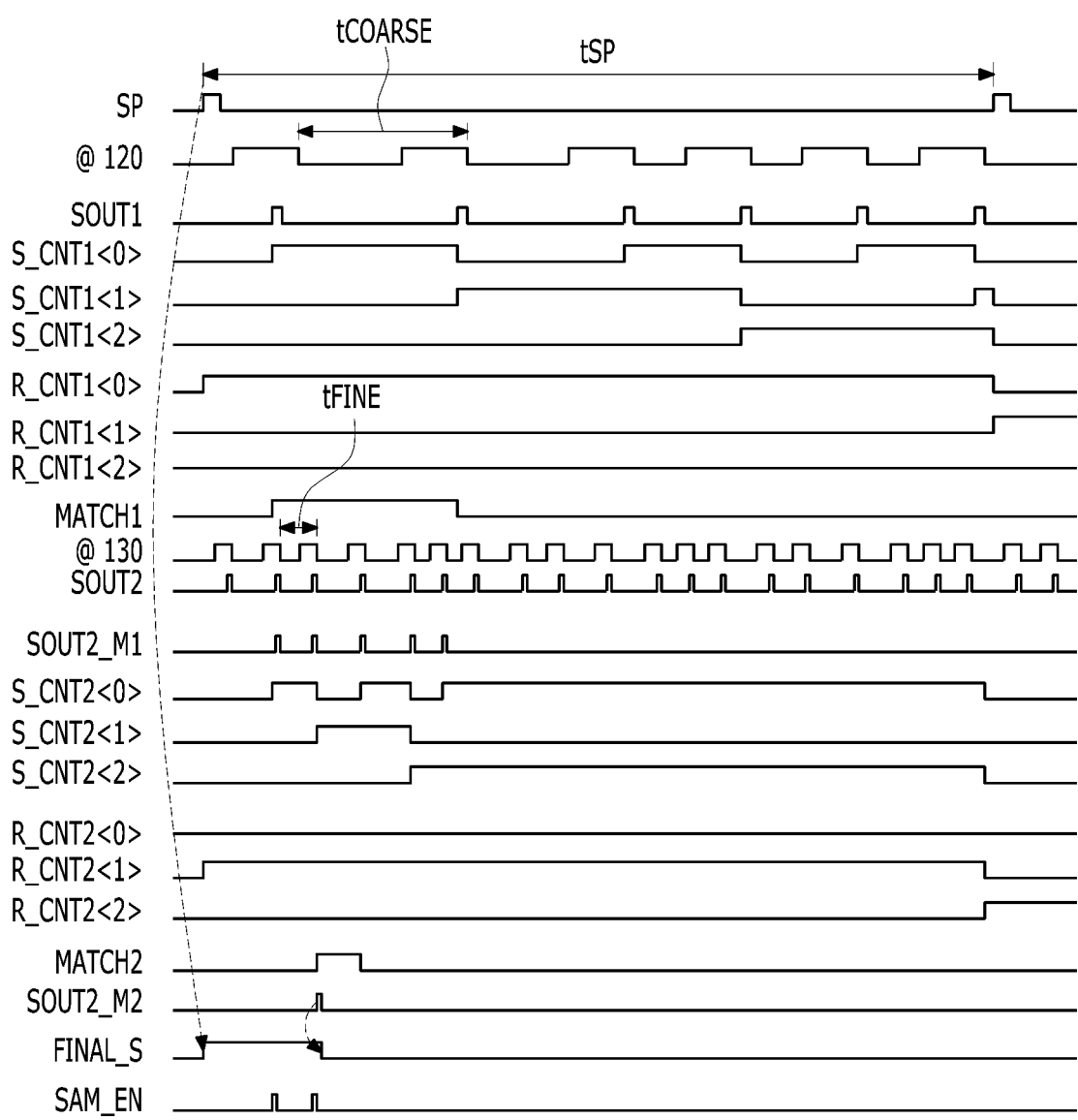
FIG. 7 is a timing diagram for describing an operation of an integrated circuit in accordance with an embodiment of the present invention.

FIG. 7 is a timing diagram for describing an operation of the integrated circuit 10 in accordance with an embodiment of the present invention.

Referring to FIG. 7, the sampling section signal SP is enabled to define a sampling section tSP. The first reference counting signal R_CNT1<2:0> and the second reference counting signal R_CNT2<2:0> may be initialized by "000".

The first pattern generation circuit 120 may output the first pattern signal SOUT1 that is randomly pulsing for the sampling section tSP. The first pattern generation circuit 120 may divide the sampling section tSP into a plurality of coarse sections tCOARSE each of which has a random period or length, and generate the first pattern signal SOUT1 that is randomly pulsing for each coarse section tCOARSE.

The second pattern generation circuit 130 may output the second pattern signal SOUT2 that is randomly pulsing for the sampling section tSP. The second pattern generation circuit 130 may divide the sampling section tSP into a plurality of fine sections tFINE each of which has a random period or length, shorter than that of the coarse sections tCOARSE, and generate the second pattern signal SOUT2 that is randomly pulsing for each fine section tFINE. Thus, the second pattern generation circuit 130 may generate the second pattern signal SOUT2 that is randomly pulsing with a period shorter than that of first pattern signal SOUT1.

The first section extract circuit 140 may randomly select one of the coarse sections tCOARSE according to the first pattern signal SOUT1, and generate the first section extract signal SOUT2_M1 by extracting the second pattern signal SOUT2 for the selected coarse section tCOARSE. In detail, the first section control part 142 may generate the first sampling counting signal S_CNT1<2:0> by counting the toggling number of the first pattern signal SOUT1, and generate the first reference counting signal R_CNT1<2:0> by counting the number of inputs of the sampling section signal SP. At this time, the first reference counting signal R_CNT1<2:0> may be increased to "001" from "000" according to the sampling section signal. The first section control part 142 may enable the coarse section signal MATCH1 when the respective bits of the first sampling counting signal S_CNT1<2:0> and the first reference counting signal R_CNT1<2:0> are identical to each other. The first filter part 144 may filter the second pattern signal SOUT2 according to the coarse section signal MATCH1, and generate the first section extract signal SOUT2_M1. The first filter part 144 may output the second pattern signal SOUT2 as the first section extract signal SOUT2_M1 for an activation section of the coarse section signal MATCH1.

The second section extract circuit 150 may select one of the fine sections tFINE according to the first section extract signal SOUT2_M1, and generate the second section extract signal SOUT2_M2 by extracting the second pattern signal SOUT2 for the selected fine section tFINE. In detail, the second section control part 152 may generate the second sampling counting signal S_CNT2<2:0> by counting the toggling number of the first section extract signal SOUT2_M1, and generate the second reference counting signal R_CNT2<2:0> by counting the number of inputs of the sampling section signal SP. At this time, the second reference counting signal R_CNT2<2:0> may be increased to "010" from "000" according to the sampling section signal. The second section control part 152 may enable the fine section signal MATCH2 when the respective bits of the second sampling counting signal S_CNT2<2:0> and the second reference counting signal R_CNT2<2:0> are identical to each other. That is, an activations section of the fine section signal MATCH2 may be sampled during the activation section of the coarse section signal MATCH1. The second filter part 154 may output the second pattern signal SOUT2 as the second section extract signal SOUT2_M2 for an activation section of the fine section signal MATCH2.

The output control circuit 160 may generate the final section signal FINAL_S that is set according to the sampling section signal SP and reset according to the second section extract signal SOUT2_M2. The output control circuit 160 may output the sampling enable signal SAM_EN by filtering the first section extract signal SOUT2_M1 according to the final section signal FINAL_S. Accordingly, the sampling enable signal SAM_EN may be generated according to the second pattern signal SOUT2 that is pulsing during the selected fine section tFINE, i.e., corresponding to the second section extract signal SOUT2_M2.

Finally, the sampling circuit 200 may generate the output signal OUT by sampling the input signal IN according to the sampling enable signal SAM_EN.

As described above, the integrated circuit 10 in accordance with an embodiment may include a pattern generation circuit 120 having a longer random sampling section and a pattern generation circuit 130 having a shorter random sampling section. The integrated circuit 10 may perform random sampling by dividing one sampling section tSP by a plurality of coarse sections tCOARSE, select one of coarse sections tCOARSE, and perform random sampling by dividing the selected coarse section tCOARSE by a plurality of fine sections tFINE. The integrated circuit 10 may sample the input signal according to the sampling result, to thereby address the periodicity of the sampling circuit and maximize the randomization of the sampling circuit.

Hereinafter, a memory device will be described as an example of an integrated circuit including a sampling circuit. However, the present invention is not limited thereto, and may be applied to all integrated circuits including a sampling circuit for randomly sampling input addresses or signals. In addition, in the following embodiments, a description of a configuration related to a data input/output operation will be omitted to focus on a refresh operation.

Figure 8:
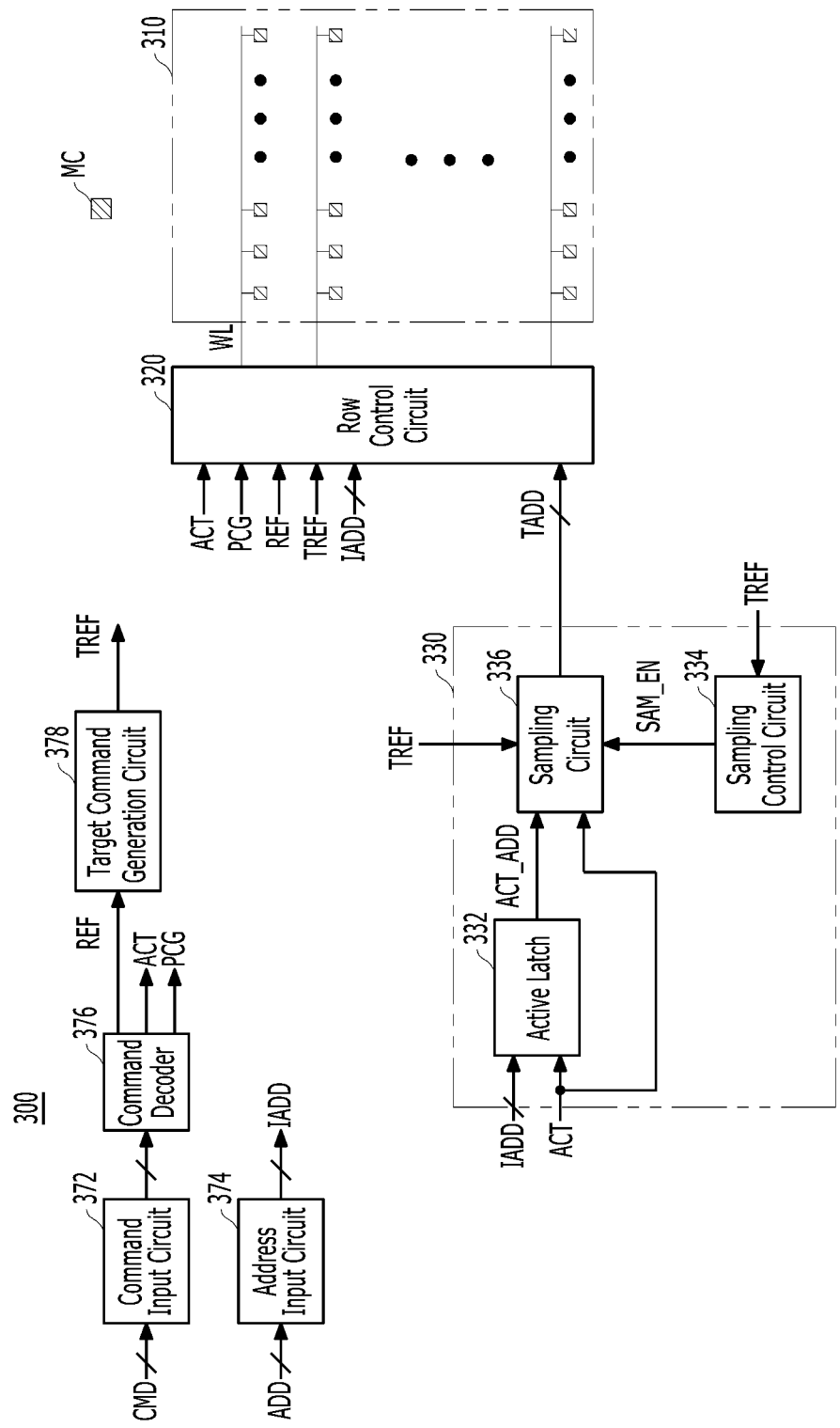
FIG. 8 is a block diagram illustrating a memory device in accordance with an embodiment of the present invention.
Figure 9:
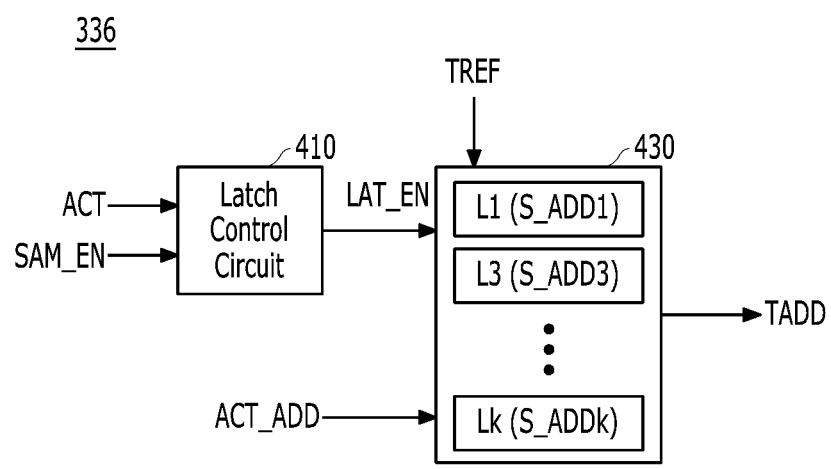
FIG. 9 is a detailed configuration diagram illustrating a sampling circuit of FIG. 8 in accordance with an embodiment of the present invention.

FIG. 8 is a block diagram illustrating a memory device 300 in accordance with an embodiment of the present invention. FIG. 9 is a detailed configuration diagram illustrating a sampling circuit 336 of FIG. 8 in accordance with an embodiment of the present invention.

Referring to FIG. 8, the memory device 300 may include a memory cell array 310, a row control circuit 320, a refresh control circuit 330, a command input circuit 372, an address input circuit 374, a command decoder 376, and a target command generation circuit 378.

The memory cell array 310 may include a plurality of memory cells MC coupled to word lines WL and bit lines. The memory cell array 310 may include a plurality of banks. The number of banks or the number of memory cells MC may be determined depending on the capacity of the memory device 300.

The command input circuit 372 may receive a command CMD, and the address input circuit 374 may receive an address ADD, from an external device e.g., a memory controller. The address input circuit 374 may receive the address ADD and output an internal input address IADD. Each of the command CMD and the address ADD may include a multi-bit signal. The command decoder 376 may decode the command CMD input through the command input circuit 372 and may generate an active command ACT, a precharge command PCG, and a normal refresh command REF. The command decoder 376 may generate a read command and a write command, as well as other commands, by decoding received commands CMD.

The target command generation circuit 378 may generate a target refresh command TREF based on the normal refresh command REF. For example, the target command generation circuit 378 may generate the target refresh command TREF whenever the number of inputs of the normal refresh command REF reaches a preset number.

The refresh control circuit 330 may latch the internal input address IADD as an active address ACT_ADD according to the active command ACT. The refresh control circuit 330 may store a plurality of sampling addresses by randomly sampling the active address ACT_ADD. The refresh control circuit 330 may sequentially output the sampling addresses as a target address TADD according to the target refresh command TREF.

In detail, the refresh control circuit 330 may include an active latch 332, a sampling control circuit 334, and a sampling circuit 336.

The active latch 332 may latch the internal input address IADD as the active address ACT_ADD according to the active command ACT.

The sampling control circuit 334 may generate a sampling enable signal SAM_EN that is randomly enabled during a target refresh section. The sampling control circuit 334 may include at least two pattern generation circuits having different periods, and generate a first pattern signal SOUT1 and a second pattern signal SOUT2, which are randomly pulsing with different periods for the target refresh section. Based on the first pattern signal SOUT1 and the second pattern signal SOUT2, the sampling control circuit 334 may generate the sampling enable signal SAM_EN. For reference, the target refresh section may be determined by the target refresh command TREF, and the target refresh section may be defined by adjacent two target refresh commands TREF. The sampling control circuit 334 of FIG. 8 may have substantially the same configuration and operation as the sampling control circuit 100 described in FIGS. 1 to 7.

The sampling circuit 336 may store the plurality of sampling addresses by sampling the active address ACT_ADD according to the active command ACT and the sampling enable signal SAM_EN. The sampling circuit 336 may store the active address ACT_ADD as one of the sampling addresses when both of the active command ACT and the sampling enable signal SAM_EN are enabled. The sampling circuit 336 may sequentially output the stored sampling addresses as the target address TADD according to the target refresh command TREF. Depending on an embodiment, the sampling circuit 336 may calculate one or more adjacent addresses using the stored sampling addresses, and output the adjacent addresses as the target address TADD.

Referring to FIG. 9, the sampling circuit 336 may include a latch control circuit 410 and a sampling latch circuit 430.

The latch control circuit 410 may generate a latch enable signal LAT_EN according to the active command ACT and the sampling enable signal SAM_EN. The latch control circuit 410 may be enabled when both of the active command ACT and the sampling enable signal SAM_EN are enabled. The sampling latch circuit 430 may include a plurality of latches L1 to Lk. The sampling latch circuit 430 may store the active address ACT_ADD in the plurality of latches L1 to Lk according to the latch enable signal LAT_EN. The sampling latch circuit 430 may store the active address ACT_ADD as the sampling addresses S_ADD1 to S_ADDk in the latches L1 to Lk, respectively, whenever the latch enable signal LAT_EN is enabled. The sampling latch circuit 430 may sequentially output any of the sampling addresses S_ADD1 to S_ADDk stored in in the latches L1 to Lk, as the target address TADD, whenever the target refresh command TREF is inputted.

The row control circuit 320 may activate a word line corresponding to the internal input address IADD in response to activation of the active command ACT, and may precharge the activated word line in response to the precharge command PCG. In order to select a word line to be refreshed during a normal refresh operation, a refresh counter (not shown) for generating a counting address that is sequentially increasing according to the normal refresh command REF may be additionally provided. The row control circuit 320 may perform the normal refresh operation of sequentially refreshing a plurality of word lines WL corresponding to the counting address according to the normal refresh command REF. The row control circuit 320 may perform the target refresh operation of refreshing one or more neighboring word lines of a word line WL corresponding to the target address TADD according to the target refresh command TREF.

Referring to FIGS. 1 to 9, an operation of the memory device 300 will be described.

When the normal refresh command REF is inputted, the refresh counter may generate the counting address that is sequentially increasing, and the row control circuit 320 may perform the normal refresh operation of sequentially refreshing the word lines WL corresponding to the counting address.

The target command generation circuit 378 may generate the target refresh command TREF whenever the number of inputs of the normal refresh command REF reaches a preset number. By the target refresh command TREF, a target refresh section may be defined.

The sampling control circuit 334 may generate the sampling enable signal SAM_EN that is randomly enabled during the target refresh section.

In detail, the first pattern generation circuit 120 may divide the target refresh section into a plurality of coarse sections tCOARSE each of which has a random period or length, and generate the first pattern signal SOUT1 that is randomly pulsing for each coarse section tCOARSE. The second pattern generation circuit 130 may divide the target refresh section into a plurality of fine sections tFINE each of which has a random period or length shorter than that of each of the coarse sections tCOARSE, and generate the second pattern signal SOUT2 that is randomly pulsing for each fine section tFINE. Thus, the second pattern generation circuit 130 may generate the second pattern signal SOUT2 that is randomly pulsing with a period shorter than that of first pattern signal SOUT1.

The first section extract circuit 140 may randomly select one of the coarse sections tCOARSE according to the first pattern signal SOUT1, and generate the first section extract signal SOUT2_M1 by extracting the second pattern signal SOUT2 for the selected coarse section tCOARSE. The second section extract circuit 150 may select one of the fine sections tFINE according to the first section extract signal SOUT2_M1, and generate the second section extract signal SOUT2_M2 by extracting the second pattern signal SOUT2 for the selected fine section tFINE. The output control circuit 160 may generate the final section signal FINAL_S that is set according to the target refresh command TREF and reset according to the second section extract signal SOUT2_M2, and output the sampling enable signal SAM_EN by filtering the first section extract signal SOUT2_M1 according to the final section signal FINAL_S.

The sampling circuit 336 may store the plurality of sampling addresses S_ADD1 to S_ADDk by sampling the active address ACT_ADD according to the active command ACT and the sampling enable signal SAM_EN, and sequentially output the stored sampling addresses as the target address TADD according to the target refresh command TREF.

The row control circuit 320 may perform the target refresh operation of refreshing one or more neighboring word lines corresponding to the target address TADD according to the target refresh command TREF.

As described above, in accordance with an embodiment, a sampling circuit using dual pattern generation circuits operating at different cycles may be applied to memory device 300 for sampling addresses based on probability and performs a target refresh operation using the sampled addresses. Accordingly, the accuracy of address sampling may be maximized, and the efficiency of the target refresh operation may be improved.

Figure 10A:
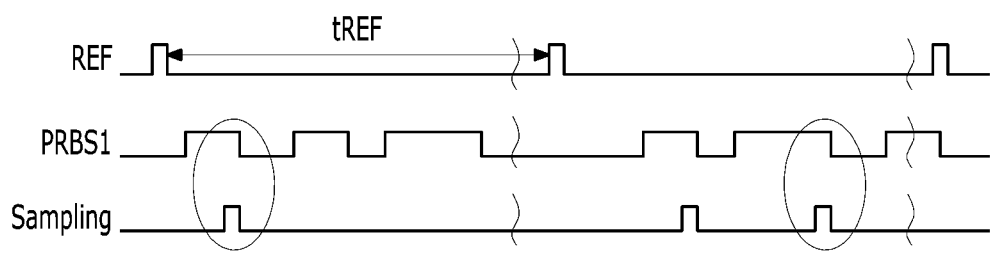
FIGS. 10A and 10B are timing diagrams for describing tendency of a sampling circuit according to the prior art and an embodiment of the present invention.
Figure 10B:
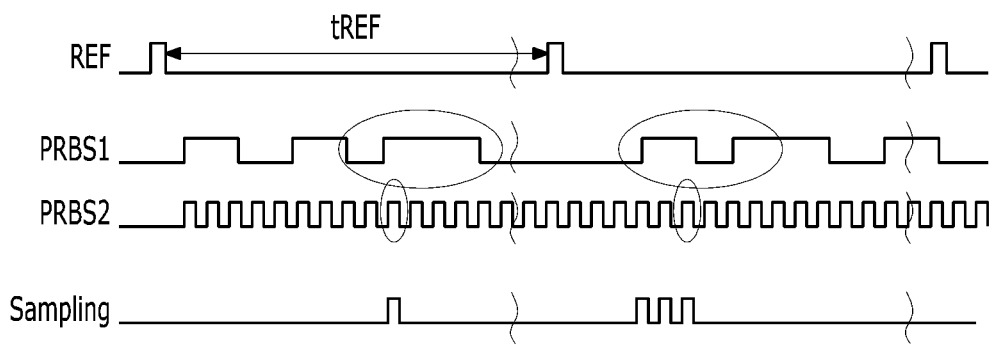

FIGS. 10A and 10B are timing diagrams for describing tendency of a sampling circuit according to the prior art and an embodiment of the present invention.

FIG. 10A is a timing diagram for describing tendency of the sampling circuit using one pattern generation circuit. FIG. 10B is a timing diagram for describing tendency of the sampling circuit using two pattern generation circuits operating at different cycles. In FIGS. 10A and 10B, the sampling circuit will be described as an example in which a PRBS-based random pattern generation circuit is configured.

Referring to FIG. 10A, when a sampling operation is performed using one pattern generation circuit PRBS1, a randomization risk exists because the sampling granularity is not high in a time axis during each target refresh section tREF, and thus has a constant tendency.

Moreover, referring to FIG. 10B, when the sampling operation is performed using two pattern generation circuits PRBS1 and PRBS2 having different resolutions, i.e., cycle or periods, the sampling granularity is increased in a time axis during each target refresh section tREF, thereby maximizing randomness.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. An integrated circuit, comprising:
   a first pattern generation circuit suitable for generating a first pattern signal randomly pulsing for a sampling section;
   a second pattern generation circuit suitable for generating a second pattern signal randomly pulsing for the sampling section;
   a first section control part suitable for generating a coarse section signal enabled for a first section of the sampling section, according to the first pattern signal;
   a first filter part suitable for generating a first section extract signal by filtering the second pattern signal according to the coarse section signal;
   a second section control part suitable for generating a fine section signal enabled for a second section of the sampling section, according to the first section extract signal;
   a second filter part suitable for generating a second section extract signal by filtering the second pattern signal according to the fine section signal;
   an output control circuit suitable for generating a sampling enable signal according to the first section extract signal and the second section extract signal; and
   a sampling circuit suitable for sampling an input signal according to the sampling enable signal.

2. The integrated circuit of claim 1, wherein the second pattern signal is randomly pulsing with a period shorter than that of the first pattern signal.

3. The integrated circuit of claim 1, wherein each of the first pattern generation circuit and the second pattern generation circuit includes one selected from a linear feedback shift register (LFSR) based random pattern generator and a pseudo-random binary sequence (PRBS) based random pattern generator.

4. The integrated circuit of claim 1, wherein each of the first pattern generation circuit and the second pattern generation circuit includes a uniform random number sequence generator for generating pattern signals randomly pulsing the same number of times within a specific period.

5. The integrated circuit of claim 1, wherein the first section control part includes:
 a first random counter suitable for generating a first sampling counting signal by counting a toggling number of the first pattern signal;
 a first reference counter suitable for generating a first reference counting signal by counting a number of inputs of a sampling section signal for defining the sampling section; and
 a first comparator suitable for outputting the coarse section signal by comparing the first sampling counting signal with the first reference counting signal.

6. The integrated circuit of claim 1, wherein the first filter part includes a logic circuit suitable for performing a logic AND operation on the second pattern signal and the coarse section signal.

7. The integrated circuit of claim 1, wherein the second section control part includes:
 a second random counter suitable for generating a second sampling counting signal by counting a toggling number of the first section extract signal;
 a second reference counter suitable for generating a second reference counting signal by counting a number of inputs of a sampling section signal for defining the sampling section; and
 a second comparator suitable for outputting the fine section signal by comparing the second sampling counting signal with the second reference counting signal.

8. The integrated circuit of claim 1, wherein the second filter part includes a logic circuit suitable for performing a logic AND operation on the second pattern signal and the fine section signal.

9. The integrated circuit of claim 1, wherein the output control circuit includes:
 a set-reset (SR) latch suitable for generating a final section signal set according to a sampling section signal for defining the sampling section and reset according to the second section extract signal; and
 a third filter circuit suitable for outputting the sampling enable signal by filtering the first section extract signal according to the final section signal.

10. An operating method of an integrated circuit, comprising:
 dividing a sampling section into a plurality of coarse sections;
 generating a first pattern signal that is randomly pulsing for each of the coarse sections;
 dividing the sampling section into a plurality of fine sections;
 generating a second pattern signal that is randomly pulsing for each of the fine sections;
 randomly selecting one of the coarse sections;
 randomly selecting one of the fine sections for the selected coarse section;
 generating a sampling enable signal according to the second pattern signal that is pulsing for the selected fine section; and
 sampling an input signal according to the sampling enable signal.

11. The operating method of claim 10,
 wherein each of the coarse sections and the fine sections has a random period, and
 wherein each of the fine sections has a random period shorter than that of each of the coarse sections.

12. The operating method of claim 10, wherein each of the first pattern signal and the second pattern signal is randomly pulsing the same number of times within a specific period.

13. The operating method of claim 10, wherein the randomly selecting one of the coarse sections includes:
 generating a first sampling counting signal by counting a toggling number of the first pattern signal;
 generating a first reference counting signal by counting a number of inputs of a sampling section signal for defining the sampling section;
 comparing the first sampling counting signal with the first reference counting signal; and
 selecting one of the coarse sections according to a result of the comparing.

14. The operating method of claim 10, wherein the randomly selecting one of the fine sections for the selected coarse section includes:
 generating a first section extract signal by filtering the second pattern signal for the selected coarse section;
 generating a second sampling counting signal by counting a toggling number of the first section extract signal;
 generating a second reference counting signal by counting a number of inputs of a sampling section signal for defining the sampling section;
 comparing the second sampling counting signal with the second reference counting signal; and
 selecting one of the fine sections according to a result of the comparing.

15. The operating method of claim 14, wherein the generating a sampling enable signal according to the second pattern signal includes:
 generating a second section extract signal by filtering the second pattern signal for the selected fine section;
 generating a final section signal, which is set according to the sampling section signal and reset according to the second section extract signal; and
 outputting the sampling enable signal by filtering the first section extract signal according to the final section signal.

16. A memory device, comprising:
 a first pattern generation circuit suitable for dividing a target refresh section into a plurality of coarse sections, and generating a first pattern signal that is randomly pulsing for each of the coarse sections;
 a second pattern generation circuit suitable for dividing the target refresh section into a plurality of fine sections, and generating a second pattern signal that is randomly pulsing for each of the fine sections;
 a first section extract circuit suitable for generating a first section extract signal by extracting the second pattern signal for a coarse section randomly selected from the coarse sections according to the first pattern signal;
 a second section extract circuit suitable for generating a second section extract signal by extracting the second pattern signal for a fine section randomly selected from the fine sections according to the first section extract signal;
 an output control circuit suitable for generating a sampling enable signal according to the first section extract signal and the second section extract signal; and a sampling circuit suitable for outputting a target address by sampling an active address according to the sampling enable signal.

17. The memory device of claim 16, wherein the second pattern signal is randomly pulsing with a period shorter than that of the first pattern signal.

18. The memory device of claim 16, wherein each of the first pattern generation circuit and the second pattern generation circuit includes a uniform random number sequence generator for generating pattern signals randomly pulsing the same number of times within a specific period.

19. The memory device of claim 16, further comprising a row control circuit suitable for refreshing one or more neighboring word lines of a word line corresponding to the target address according to a target refresh command for defining the target refresh section.

20. The memory device of claim 16, wherein the sampling circuit includes:
- a latch control circuit suitable for generating a latch enable signal according to an active command and the sampling enable signal; and
- a sampling latch circuit suitable for storing the active address as a plurality of sampling addresses according to the latch enable signal and outputting the sampling addresses as the target address according to a target refresh command for defining the target refresh section.

* * * * *